US007737016B2

(12) United States Patent
Blatchford et al.

(10) Patent No.: US 7,737,016 B2
(45) Date of Patent: Jun. 15, 2010

(54) TWO-PRINT TWO-ETCH METHOD FOR ENHANCEMENT OF CD CONTROL USING GHOST POLY

(75) Inventors: James Walter Blatchford, Richardson, TX (US); Benjamen Michael Rathsack, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 827 days.

(21) Appl. No.: 11/482,041

(22) Filed: Jul. 7, 2006

(65) Prior Publication Data

US 2008/0014684 A1    Jan. 17, 2008

(51) Int. Cl.
*H01L 21/3205* (2006.01)
(52) U.S. Cl. .................. 438/587; 438/128; 438/129
(58) Field of Classification Search .............. 438/128, 438/587
See application file for complete search history.

(56) References Cited

U.S. PATENT DOCUMENTS

2007/0105391 A1* 5/2007 Hashimoto et al. .......... 438/717

OTHER PUBLICATIONS

Kuo, Chen-Cheng "Extension of deep-ultraviolet lithography for patterning logic gates using alternating phase shifting masks" J. Vac. Sci. Technol. B 17(6), Nov./Dec. 1999.*

Peterson, John "Designing Dual-Trench Alternating Phase-Shift Masks for 140 nm and Smaller Features Using 248 nm KRF and 193 nm ARF Lithography" Proc. SPIE 3412 503 Apr. 1998.*

* cited by examiner

*Primary Examiner*—N Drew Richards
*Assistant Examiner*—Grant S Withers
(74) *Attorney, Agent, or Firm*—Warren L. Franz; Wade J. Brady, III; Frederick J. Telecky, Jr.

(57) ABSTRACT

According to various embodiments, two-print two-etch methods and devices are disclosed that can be used to form features, such as ghost features, on a substrate. The disclosed methods can be incorporated into, for example, altPSM, attPSM, and binary lithographic method for making semiconductor devices. a method of forming a semiconductor device is provided. The exemplary methods can include defining a plurality of first features and at least one ghost feature on a photosensitive layer by exposing a first mask to a light, wherein the first mask comprises a plurality of phase shift areas that change a phase of the light. A portion of a layer disposed under the photosensitive layer can be removed by etching to form the plurality of first features and the at least one ghost feature. One or more structures not requiring phase shifting can then be defined on the photosensitive layer by exposing a second mask to the light, wherein the second mask removes the at least one ghost feature. A second portion of the layer disposed under the photosensitive layer can then be removed by etching to form one or more structures not requiring phase shifting, wherein the second portion includes the at least one ghost feature.

10 Claims, 4 Drawing Sheets

TWO-PRINT TWO-ETCH METHOD FOR ENHANCEMENT OF CD CONTROL USING GHOST POLY

FIELD OF THE INVENTION

The invention relates generally to photolithography for forming integrated circuit devices. More particularly, the invention relates to two-print two-etch methods and devices for improved gate critical dimension variation.

BACKGROUND OF THE INVENTION

Lithographic projection apparatus (tools) can be used, for example, in the manufacture of integrated circuits (ICs). When using the various tools, a mask can be used that contains a circuit pattern corresponding to an individual layer of the IC, and this pattern, usually having many designs, can be imaged onto a target portion (e.g., comprising one or more dies) on a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time.

One of the goals in IC fabrication is to faithfully reproduce the original circuit design on the wafer using the mask. Another goal is to use as much of the wafer real estate as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

To achieve these goals, techniques utilizing resolution-enhanced optical lithography technology ("RET") have become popular as techniques for providing patterns with sub-wavelength resolution. These methods include alternating phase-shifting mask ("altPSM") lithography, attenuated phase-shifting mask ("attPSM") lithography, and binary lithography. In altPSM, for example, opposite phases of light are shed on two sides of a critical feature such that the destructive interference between the opposite light phases can make the printed shape sharper. Generally, the critical features are imaged using a phase shift photomask and the non-critical and trim features are imaged in a second exposure using a conventional chrome-on-glass mask, such as a structure or trim photomask. In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and images the circuit pattern, typically with a 4× to 5× reduction factor, on a photoresist film formed on a silicon wafer. The term "chrome" refers to an opaque masking material that is typically but not always comprised of chrome.

Further, transistor matching requirements for advanced technology nodes, such as less than 1.0 μm, require exquisite CD control, beyond the capability of current lithography and etch tools and processes. An important component of variation is matching between gates in the interior of an array of active gates, e.g., over the same active region, and those on the end of the array. For example, for the 45 nm technology node, the CD variation for the end gates in an array of gates can be a factor of 2 to 3 times larger than that of the interior active gates of the array.

For example, FIG. 1A shows a conventional gate array 100 having end gates 110a and 110b and interior gates 120a, 120b, and 120c formed on substrate 130. Conventional gate array 100 is formed using a conventional lithography process, such as altPSM, attPSM, or binary lithography. One problem is that end gates 110a and 110b can have two to three times more variation in size than internal gates 120a, 120b, and 120c. As shown in FIG. 1A, the conventional processes can form end gates that can vary in size from, for example, 110a and 110b that are similar in size to interior gates 120a-c to 110a' and 110b' that are 2 to 3 times larger than interior gates 120a-c. This size variation can affect transistor leakage and performance.

In some instances, dummy gates, such as dummy gates 110a and 110b shown in FIG. 1B, are formed on a substrate 130 adjacent to interior gates 120a and 120c, respectively, to aid the control and sizing of internal gates 120a-c. Problems arise in conventional processes because dummy gates remain on the wafer even after the device is complete. Dummy gates residing on the wafer are then processed in a similar way as active gates are processed. For example, sidewall spacers 112 are subsequently formed on the sides of the dummy gates 110a and 110b. Problems occur because the sidewall spacers on the dummy gates can increase or decrease stress (e.g., compressive and/or tensile) on the active interior gates thereby interfering with device performance. Further, the presence of the dummy gates can cause unwanted polysilicon capacitance. In addition, the dummy gates can be a source of defect problems, for example breaking over the gate oxide, during further processing. In an attempt to compensate for this interference, dummy gates must be formed far away from the active gates, as shown in FIG. 1B. As such, dummy gates are spaced at pitches significantly different than the pitch of active gates taking up valuable real estate on the chip.

Thus, there is a need to overcome these and other problems of the prior art to control the size of features formed on a substrate.

SUMMARY OF THE INVENTION

In accordance with an exemplary embodiment, a set of masks for use in making a semiconductor device is provided. The set of masks can include a first mask comprising a plurality of phase shift areas and a first plurality of opaque areas, wherein the first plurality opaque areas define at least one first feature and at least one ghost feature. The set of masks can further include a second mask comprising at least one second opaque area and a clear or transparent area, wherein the at least one second opaque area defines structures not requiring phase shifting, and wherein the clear area allows removal of the at least one ghost feature.

In accordance with an exemplary embodiment, a method of forming a semiconductor device is provided. The method can include defining a plurality of first features and at least one ghost feature on a photosensitive layer by exposing a first mask to a light, wherein the first mask comprises a plurality of phase shift areas that change a phase of the light. A portion of a layer disposed under the photosensitive layer can be removed by etching to form the plurality of first features and the at least one ghost feature. One or more structures not requiring phase shifting can then be defined on the photosensitive layer by exposing a second mask to the light, wherein the second mask removes the at least one ghost feature. A second portion of the layer disposed under the photosensitive layer can then be removed by etching to form one or more structures not requiring phase shifting, wherein the second portion comprises the at least one ghost feature.

In accordance with other exemplary embodiments, a computer readable medium containing program code that configures a processor to perform a method of making masks for forming features on a semiconductor device is provided. The computer readable medium can include program code for forming a first mask, wherein the first mask comprises a plurality of phase shift areas and a first plurality of opaque areas, and wherein the first plurality opaque areas define at least one first feature and at least one ghost feature. The computer readable medium can further include program code for forming a second mask, wherein the second mask comprises at least one second opaque area and a clear or transparent area, wherein the at least second opaque area defines structures not requiring phase shifting, and wherein the clear area allows removal of the at least one ghost feature.

In accordance with still other exemplary embodiments, a method of forming a semiconductor device is provided. The method can include defining a plurality of first features and at least one ghost feature on a photosensitive layer by exposing a first mask to a light. A portion of a layer disposed under the photosensitive layer can be removed using a first etch to form the plurality of first features and the at least one ghost feature. One or more structures not requiring phase shifting can then be defined on the photosensitive layer by exposing a second mask to the light. A second etch can be used to remove a second portion of the layer disposed under the photosensitive layer to form one or more structures not requiring phase shifting, wherein the second portion comprises the at least one ghost feature.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Figure 1A:
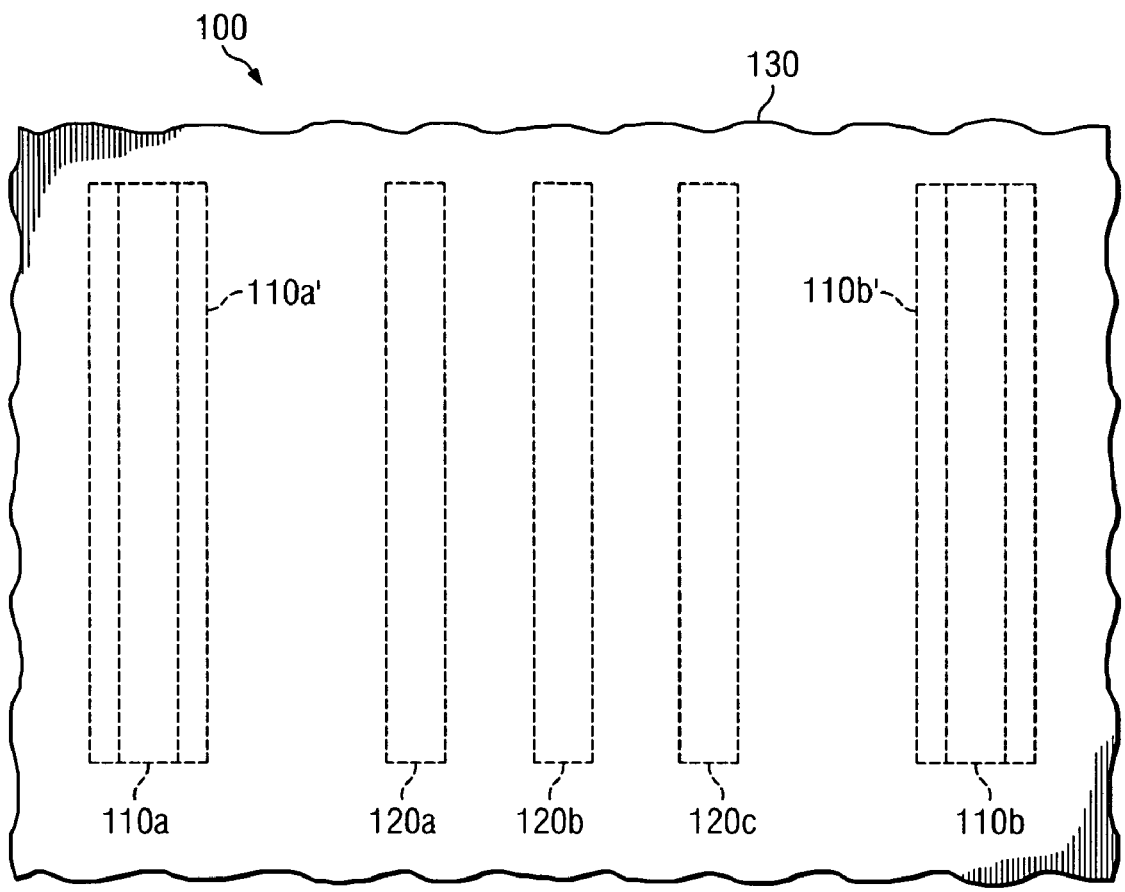
FIG. 1A depicts a portion of a conventional substrate.
Figure 1B:
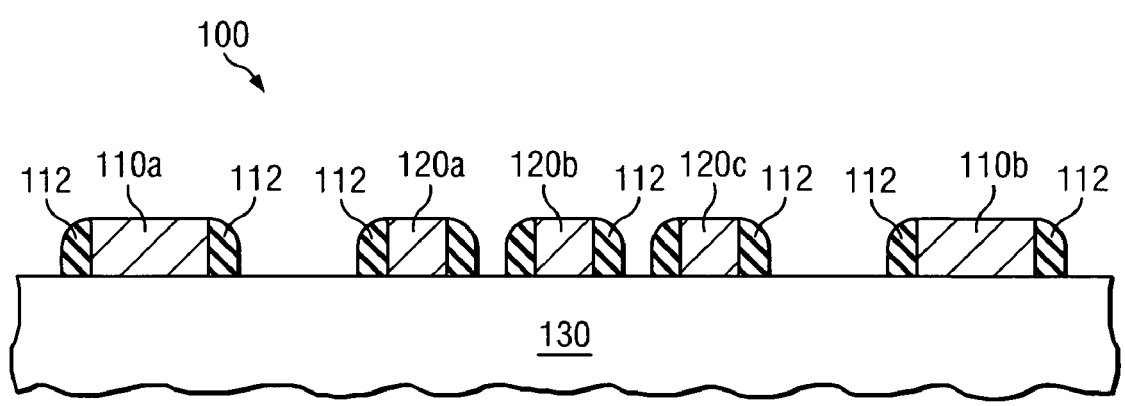
FIG. 1B depicts a portion of another conventional substrate.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Although reference is made herein to the use of the invention in the manufacture of semiconductor devices, such as ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text can be considered as being replaced by the more general terms "mask", "substrate", and "target portion", respectively.

The term mask layout, as used herein, can be broadly interpreted as referring to a schematic used to make a semiconductor device. The mask layout is used to form a mask.

The term design, as used herein, can be broadly interpreted as referring to geometric shapes on the mask layout that correspond to mask features formed on a mask and/or features formed in/on the substrate.

The term mask, as used herein, can be broadly interpreted as referring to a device comprising mask features that can be used to endow an incoming beam with a patterned cross-section, corresponding to a target pattern, that is to be created in/on a target portion of a substrate.

The term feature, as used herein, can be broadly interpreted as referring to an element of a semiconductor device. Examples of a feature can include a gate, a gate bus, a well, an isolation structure, an interconnect line, a space, a contact hole, a pillar, a resistor, a ghost feature, or any other element of a semiconductor device or other device as will be understood by one of ordinary skill in the art.

The term mask feature, as used herein, can be broadly interpreted as referring to a geometric design on a mask. A mask feature can be used to pattern a feature on a substrate. Alternatively, a mask feature can be a resolution enhancement technique (RET) design, such as a sub-resolution assist feature (SRAF), or another optical proximity correction (OPC) technique that assists in forming a feature on the substrate but is not itself formed on the substrate. Still further, multiple mask features can be used to form structures on the substrate. The multiple structures, when finally formed, can combine to form a desired feature.

The term ghost feature (also referred to herein as ghost polysilicon, ghost poly, ghost gate, or ghost poly gate), as used herein, can be broadly interpreted as referring to a structure used to improve the critical dimension control when forming semiconductor devices by removing or minimizing the differences in OPC and responses to process variations. Ghost features can be structures initially formed on a substrate but later removed. In most cases, the ghost features are formed next to a feature that remains on the substrate. For example, a ghost feature, such as a ghost gate, can be formed at the end of a gate array so that the environment at the end of the gate array is similar to the environment in the interior of the gate array. Generally, the environment can include, for example, feature pitch and how well the printed feature size and/or shape conform to the intent of the original mask layout.

Ghost features can be used to reduce the critical dimension variation, such as, for example, for gates at the end of a gate array. For example, when using ghost gates, the critical dimension of gates at the end of the gate array (i.e., the last gate in an array for gates) can be from about 0% to about 10% more than the critical dimension of gates in the interior of the array. This is a significant improvement over current methods that do not use ghost features, where features, such as the last gates in the array, are two to three times the size of gates at the interior of the gate array. Moreover, because ghost features are removed from the wafer, they are not subject to further processing steps that include additional design restrictions and can lead to detrimental device interference.

Ghost features can be made of the same material as the other features concurrently formed. In the case of an array of gates made from a layer of polysilicon, for example, the ghost gate can be formed from the same layer of polysilicon. In other instances, however, where the layer is made of another material, such as a metal, a semiconductor, or an insulator, the ghost feature can be made of that material.

The term substrate as used herein can be broadly interpreted to include any suitable material, for example, single crystalline silicon, sapphire, gallium arsenide, polycrystalline materials, insulators, metals, or the like. The substrate may contain various features and various layers.

Figure 2:
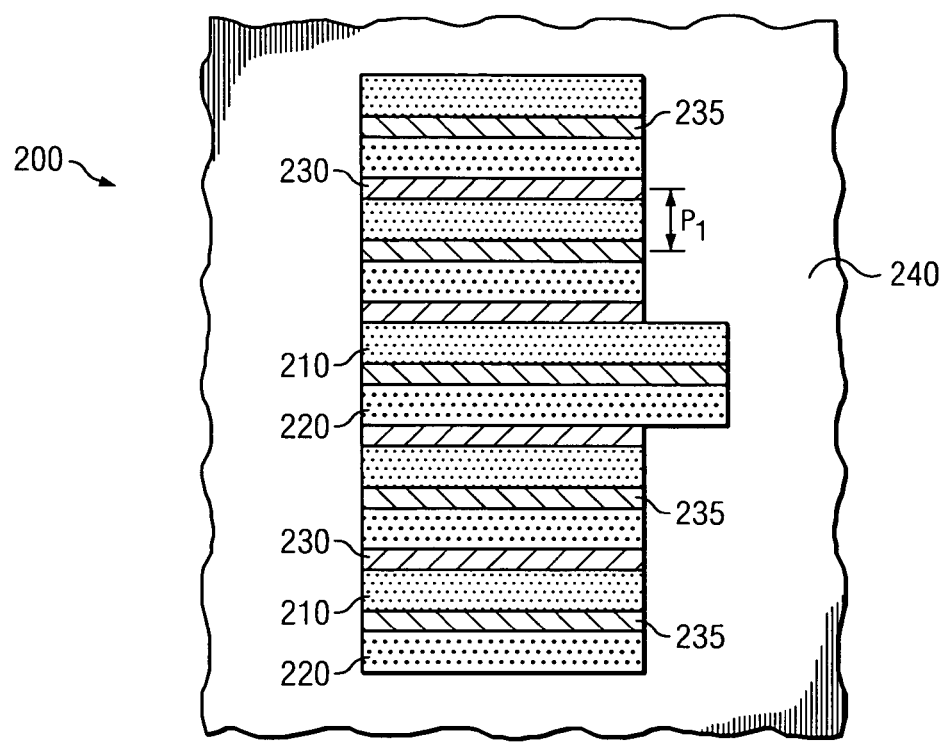
FIG. 2 depicts an exemplary phase shift mask in accordance with the present teachings.

FIGS. 2-8 depict exemplary two-print two-etch methods and devices that are used to form features on a substrate. Although FIGS. 2-8 depict exemplary altPSM methods and devices, one of ordinary skill in the art will understand that other two-print two-etch methods in accordance with the present teachings are contemplated, such as, for example, attPSM and binary lithography. FIG. 2 is a top view of a portion of a first mask 200 used at, for example, a poly level to form a gate structure. First mask 200 can be a phase shift mask including a plurality of phase shift areas. In various embodiments, the phase shift areas can include clear 0 degree phase areas 220 and clear 180 degree phase areas 210. Generally, 0 degree phase areas 220 are disposed adjacent to 180 degree phase areas 210. These clear phase shift areas allow light to pass through such that destructive interference occurs at the boundary between the areas. For example, 180 degree phase areas 210 can have a thickness so that it creates destructive interference at its boundary with 0 degree phase areas 220.

First mask 200 can further include a first plurality of opaque areas 230 that define a first feature, such as, for example, a plurality of gates. The gates can be spaced apart at a pitch $P_1$. First plurality of opaque areas 230 can be, for example, chrome placed over the boundary between a 0 degree phase area 220 and a 180 degree phase area 210. Opaque areas 230 do not allow for transmission of light. The width of opaque areas 230 is variable and can control, for example, the width of the gate structures.

First mask 200 can also include one or more second opaque areas 235 that define one or more ghost features. A ghost feature can be positioned adjacent to one or both end gates of the plurality of gates. The ghost gates can be spaced apart from the end gate at a pitch $P_1$ or spaced apart at a pitch other than $P_1$. Second plurality of opaque areas 235 can also be, for example, chrome placed over the boundary between a 0 degree phase area 220 and a 180 degree phase area 210. The ghost features defined by second opaque areas 235 can be disposed at one or both ends of the first plurality of opaque areas that define the plurality of gates.

First mask 200 can further include a third opaque area 240 that covers the remainder of the portion of first mask 200. Third opaque area 240 can, for example, protect an underlying photoresist layer from exposure so that a structure can be patterned on the photoresist layer by a subsequent mask.

Figure 3:
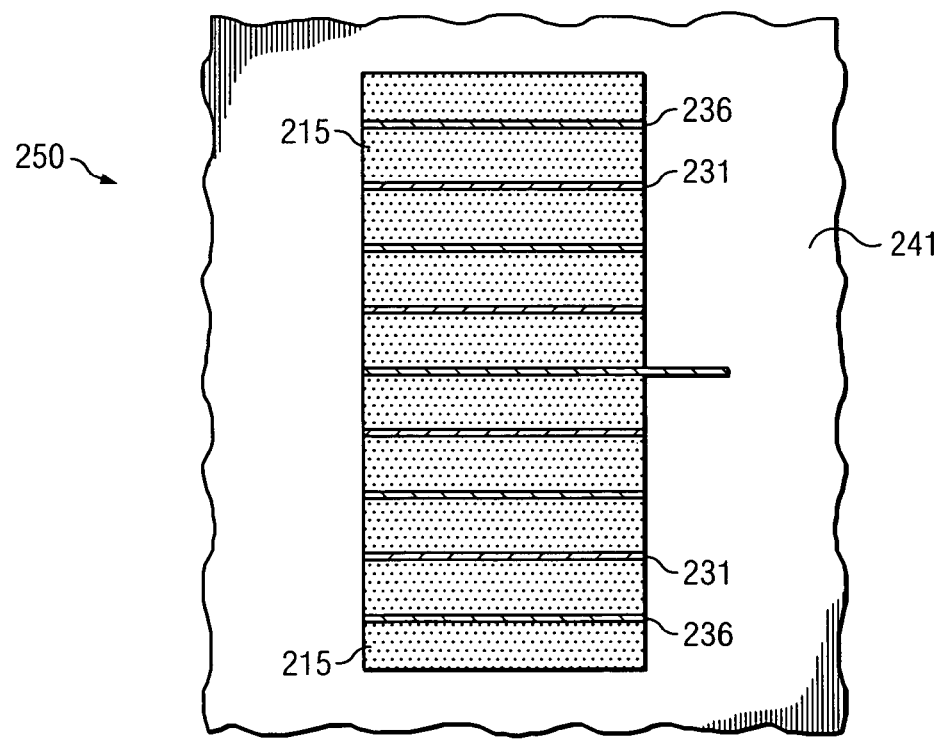
FIG. 3 depicts an exemplary image from a phase shift mask in accordance with the present teachings.

FIG. 3 is a top view of a phase shift mask image 250. Phase shift mask image 250 depicts a surface, for example a photoresist coated polysilicon layer, exposed using first mask 200. Dark area 241 represents an area not exposed to light due to third opaque area 240. Light areas 215 represent areas exposed to light due to a 0 degree phase area 220 and a 180 degree phase area 210. Gate dark areas 231 represent gate areas not exposed to light due to first plurality of opaque areas 230 and thereby formed after a first etch. Similarly, ghost feature areas 236 represent ghost feature areas not exposed to light due to second plurality of opaque areas 235 and formed after a first etch.

Figure 4:
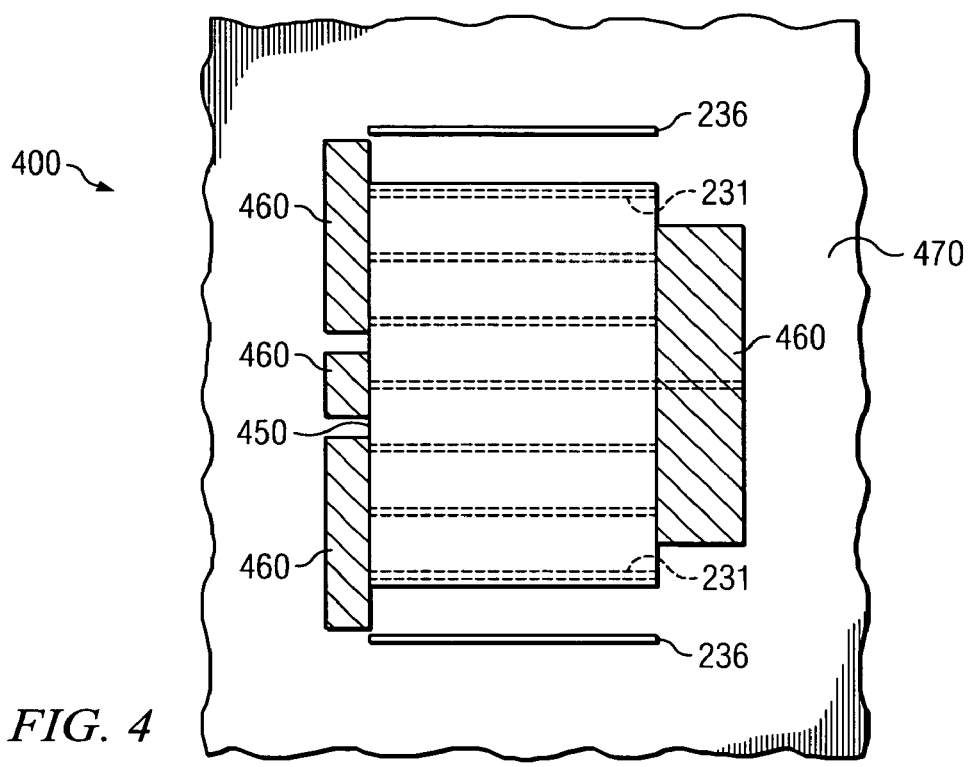
FIG. 4 depicts an exemplary structure or trim mask in accordance with the present teachings.

FIG. 4 is a top view of a portion of a second mask 400 aligned, for example, to protect the gate structure formed by first mask 200, and to remove ghost features and other unwanted features. Second mask 400 can be, for example a structure mask or trim mask. It can include a first opaque area 450 to protect the gate areas 231 formed using first mask 200 from exposure to light. A plurality of second opaque areas 460 can define desired circuit structures. Second mask 400 can further include a clear area 470 that can allow transmission of light. In various embodiments, clear area 470 can include the area of ghost features 236. Ghost features 236 can thus be removed from the pattern during a second etch.

Figure 5:
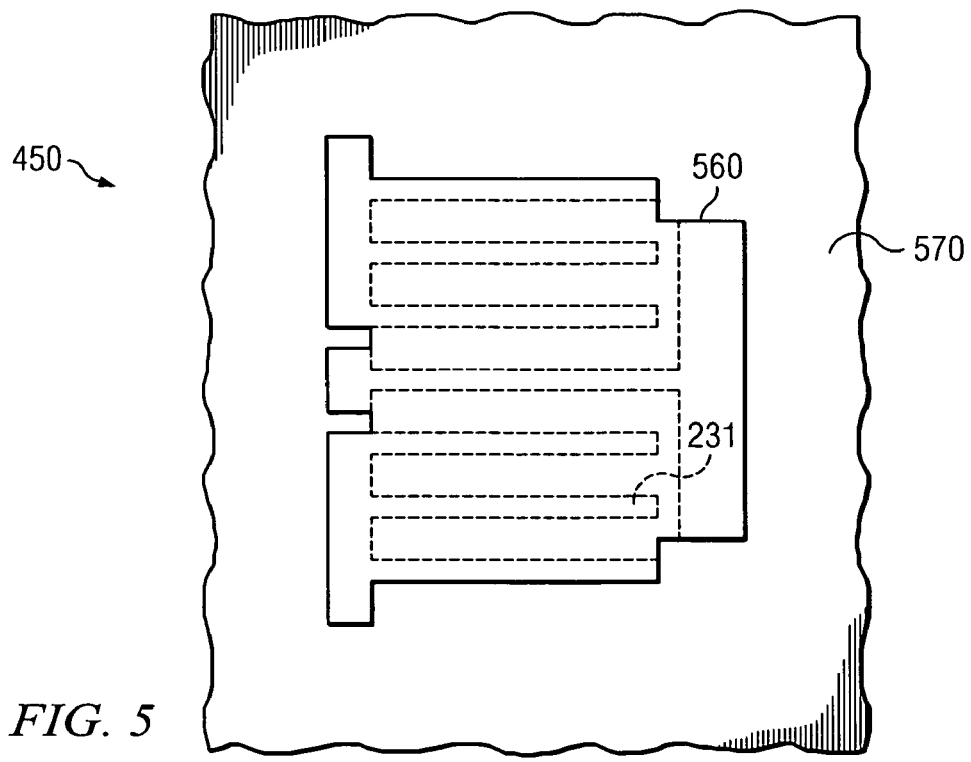
FIG. 5 depicts an exemplary image from a structure or trim mask in accordance with the present teachings.

FIG. 5 shows a top view of a structure mask image 450 after the second etch removes ghost features 236. Structure mask image 450 depicts a surface, for example a photoresist coated polysilicon layer, exposed using second mask 400. Light area 570 represents an area exposed to light, including the area from which ghost features 236 were removed, and dark area 560 represents an area protected from light exposure by first opaque area 450 (covering gates 231) and second opaque areas 460.

Figure 6:
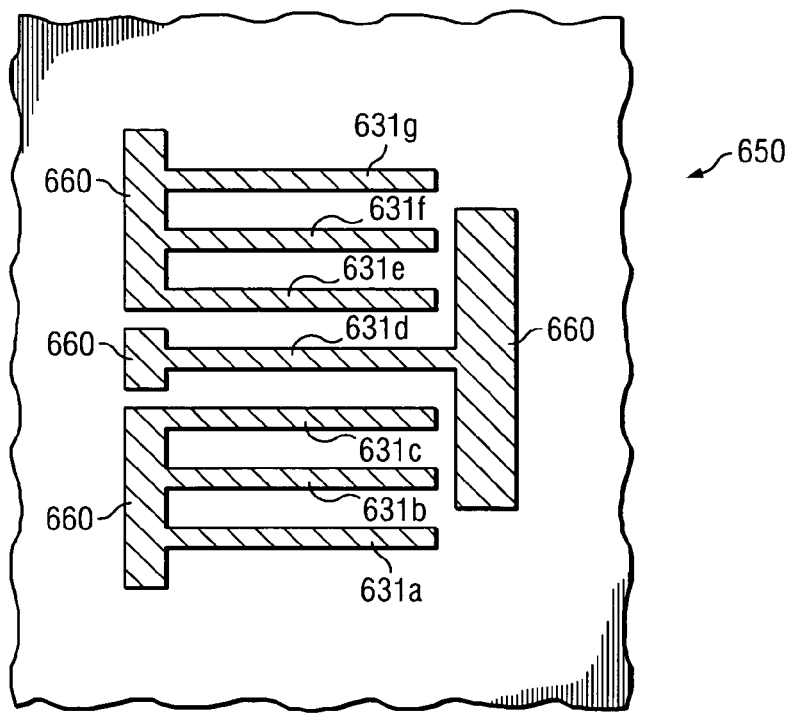
FIG. 6 depicts an exemplary image from a phase shift mask and a structure or trim mask in accordance with the present teachings.

FIG. 6 shows a resultant image 650 after exposure by first mask 200 and second mask 400. Resultant image 650 can include a plurality of gates 631a-g and a plurality of circuit structures 660. According to various embodiments, gates 631a-g can form an array of gates in which each gate is formed at a predetermined pitch. Referring back to FIG. 3, ghost gates 236 can be formed at the same or different pitch away from an active gate. Pitch (also called contacted pitch) for the 45 nm logic node can be from about 160 nm to about 190 nm. For the 90 nm logic node, the pitch can be about 300 nm to about 360 nm. The embodiments of the invention described herein, are particularly well suited to logic nodes of less than about 1 µm.

Although shown as straight bars, gates 631a-g can be other than straight bars and can have, for example, complex geometries made up of multiple shapes. The multiple shapes, when patterned onto the underlying layer, can combine to form a desired feature.

The present teachings enable dummy structures, such as ghost features 236, to be used for altPSM. Because of the need to place 0 and 180 degree phase shifting masks, dummy structures are usually drawn attached to the field poly routing or the neighboring unpatterned region thereby shorting the device. This allows the dummy structure to fully shield the full length of the transistor all the way up to the routing on the field poly. Use of the ghost structures disclosed herein, allows the dummy structures to fully cover the gates without shorting it to routing. Moreover, because the ghost features are removed by the second etch, stress on the active gates can be controlled, unwanted poly capacitance can be avoided, and potential defect problems due to breakage of the dummy structures can be avoided.

Figure 7:
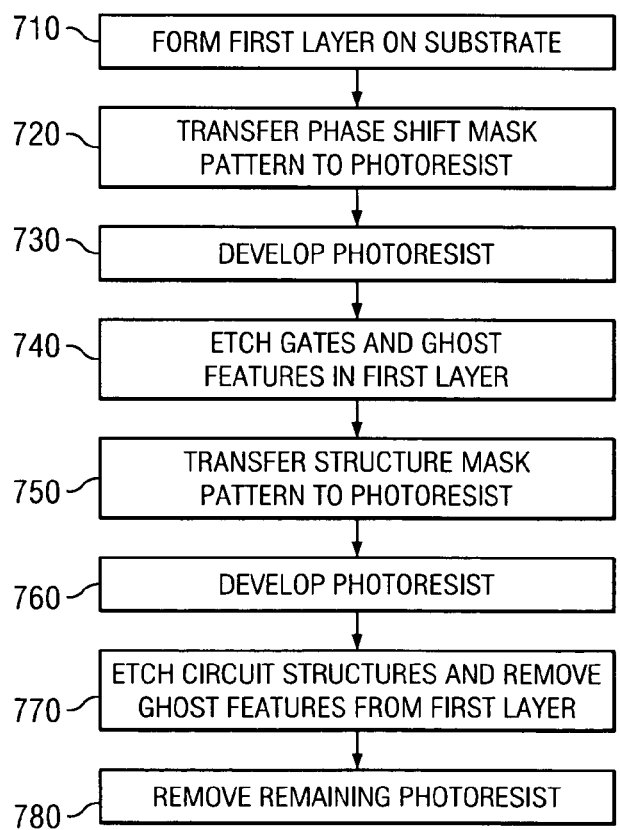
FIG. 7 shows an exemplary method for forming a semiconductor device in accordance with the present teachings.

An exemplary method 700 for forming a semiconductor device is shown in FIG. 7. At 710, a first layer, including one or more of a hardmask and a polysilicon layer, can be formed on a substrate and a photoresist layer can be formed on the first layer. At 720, a beam can be used to transfer the pattern of a phase shift mask that includes gates features and ghost features to the photoresist. For example, the pattern of phase shift mask 200 can be transferred to the photoresist, as shown in FIG. 3, such that the image includes gate features 231 and ghost features 236. At 730, the photoresist with the pattern of the phase shift mask can be developed. The gate features and the ghost features in the photoresist, as shown for example in FIG. 6, can then be patterned at 740 into the first layer by a first etch.

After forming the gate features and the ghost features in the first layer, the beam can then be used to transfer the pattern of a structure mask to the photoresist at 750. For example, the pattern of structure mask 400 can be transferred to the photoresist, as shown in FIG. 5, such that the image includes desired circuit structures 560 and removes the ghost features 236. The structure mask can be aligned to protect the gate features from exposure. At 760, the photoresist including the pattern of structure mask can be developed. At 770, the circuit structure features in the photoresist, as shown for example in FIG. 6, can be patterned to the first layer by a second etch. The second etch also removes the ghost features formed in the first layer after the previous etch. The remaining photoresist can then be removed at 780. In other embodiments where the first layer comprises a hardmask and a poly layer, the gate features and the circuit structure features can be transferred first to the hardmask and then transferred to the poly. Alternatively, when only a photoresist and poly layer are present, the gate features and the circuit structure features in the photoresist can be transferred directly to the poly layer.

In an embodiment where the first layer comprises a hardmask and a poly layer, the gate features and the circuit structure features in the photoresist can be transferred to the hardmask and then transferred to the poly. Exemplary hardmask materials can include SiON, SiN, $SiO_2$, as well as other materials known to one of ordinary skill in the art. Alternatively, when only a photoresist and poly layer are present, the gate features and the circuit structure features in the photoresist can be transferred directly to the poly layer.

While the disclosed exemplary method relates to an altPSM implementation, one of ordinary skill in the art will understand that other embodiments are contemplated, for example, for attPSM and binary lithography.

According to various other embodiments, a computer readable medium containing program code is provided that configures a processor to make a first mask and a second mask for forming an array of features on a substrate used as a semiconductor device. The program code can comprise program code for forming a plurality of mask features on a first mask. According to various embodiments, the first mask can be a phase shift mask including gate features and ghost features. When the first mask is exposed to a first beam, such as a light source, the corresponding features are patterned into a photoresist that is formed on the substrate. In some cases, the patterned features in the photoresist can be etched into a hardmask or into a poly layer. The ghost gates can be formed adjacent to a last active gate in the array of active gates. Moreover, the active gates can be spaced from each other at a pitch of ($P_1$). The ghost gates can also be spaced from the corresponding last active in the array at the same of different pitch.

According to various embodiments, there is also included program code for forming a second mask. The second mask can comprise a first opaque region that masks the array of active gates from a second beam, such as a light source. The second mask can also comprise a transparent region that permits the second beam to impinge on at least one feature formed in the hardmask or poly, such as at least one ghost gate. Alternatively, the second mask can be used to expose the images of the ghost features in a photoresist and thereby erase the ghost feature images. In any case, the ghost features are not left on the substrate.

While the invention has been illustrated with respect to one or more implementations, alterations and/or modifications can be made to the illustrated examples without departing from the spirit and scope of the appended claims. For example, while an exemplary two-print two-etch implementation for altPSM has been shown in FIGS. 2-8, other implementations, for example, for attPSM and binary lithography, are contemplated. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device, comprising:
    defining a plurality of first features and at least one ghost feature on a photosensitive layer by exposing a first mask to a light, wherein the first mask comprises a plurality of phase shift areas that change a phase of the light;
    removing by a first etch a first portion of a layer disposed under the photosensitive layer to form the plurality of first features and the at least one ghost feature;
    following the first etch, defining one or more structures not requiring phase shifting on the photosensitive layer by exposing a second mask to the light, wherein the second mask removes the at least one ghost feature; and
    removing by a second etch a second portion of the layer disposed under the photosensitive layer to form one or more structures not requiring phase shifting, wherein the second portion comprises the at least one ghost feature.

2. The method of forming a semiconductor device of claim 1, wherein the layer disposed under the photosensitive layer comprises one or more of a hardmask layer and a polysilicon layer.

3. The method of forming a semiconductor device according to claim 1, wherein the plurality of first features is an array of gates, and wherein the at least one ghost feature comprises at least one ghost feature disposed adjacent to an end gate at ends of the array of gates.

4. The method of forming a semiconductor device according to claim 3, wherein gates of the array of gates are spaced from each other at a first pitch, and wherein the ghost features are spaced from the end gates in the array of gates at the first pitch.

5. The method of forming a semiconductor device according to claim 1, wherein the step of removing the first portion of the layer disposed under the photosensitive layer to form the first features and the step of defining one or more structures not requiring phase shifting includes patterning one or more of a hardmask layer and a polysilicon layer.

6. A method of forming a semiconductor device, comprising:
  defining a plurality of first features and at least one ghost feature on a photosensitive layer by exposing a first mask to a light;
  using a first etch to remove a first portion of a layer disposed under the photosensitive layer to form the plurality of first features and the at least one ghost feature;
  following the first etch, defining one or more structures not requiring phase shifting on the photosensitive layer by exposing a second mask to the light; and
  using a second etch to remove a second portion of the layer disposed under the photosensitive layer to form the one or more structures not requiring phase shifting, wherein the second portion includes the at least one ghost feature.

7. The method of forming a semiconductor device according to claim 6, wherein the plurality of first features is an array of gates, and wherein the at least one ghost feature comprises at least one ghost feature disposed adjacent to an end gate at ends of the array of gates.

8. The method of forming a semiconductor device according to claim 6, wherein the method comprises at least one of altPSM, attPSM, and binary lithography.

9. A method of forming a semiconductor device, comprising:
  providing a first mask having a plurality of phase shift areas and first opaque areas; the first opaque areas defining an array of gates and ghost features spaced from end gates in the array of gates;
  providing a second mask having second opaque area and transparent areas; the second opaque areas defining structures not requiring phase shifting, and the transparent areas matching the first opaque areas that define the ghost features;
  defining the array of gates and the ghost features on photoresist by exposing the first mask to light; the phase shift areas acting to change a phase of the light;
  using a first etch to remove a first portion of a layer disposed under photoresist to form the array of gates and the ghost features;
  following the first etch, defining one or more structures not requiring phase shifting on photoresist by exposing the second mask to light; wherein the second mask transparent areas expose photoresist over the formed ghost features; and
  using a second etch to remove a second portion of the layer disposed under photoresist to form the structures not requiring phase shifting; the removed second portion including the at least one ghost features.

10. The method of forming a semiconductor device according to claim 9, wherein the method comprises at least one of altPSM, attPSM, and binary lithography.

\* \* \* \* \*